US009288609B2

(12) United States Patent
Kwon et al.

(10) Patent No.: US 9,288,609 B2
(45) Date of Patent: Mar. 15, 2016

(54) METHOD FOR CONNECTING WITH EXTERNAL DEVICE AND ELECTRONIC DEVICE THEREOF

(71) Applicant: Samsung Electronics Co., Ltd., Suwon-si, Gyeonggi-do (KR)

(72) Inventors: Ki-Hyun Kwon, Seoul (KR); Myung-Geun Koh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 14/244,163

(22) Filed: Apr. 3, 2014

(65) Prior Publication Data

US 2014/0302799 A1  Oct. 9, 2014

(30) Foreign Application Priority Data

Apr. 9, 2013 (KR) .................. 10-2013-0038683

(51) Int. Cl.
  H04M 1/00  (2006.01)
  H04W 4/00  (2009.01)
  H03G 3/02  (2006.01)
  H04M 1/725  (2006.01)

(52) U.S. Cl.
  CPC ............... *H04W 4/005* (2013.01); *H03G 3/02* (2013.01); *H04M 1/7253* (2013.01); *H04M 1/7258* (2013.01); *H04M 1/72558* (2013.01); H04M 2250/22 (2013.01)

(58) Field of Classification Search
  CPC .... H04M 1/7253; H04M 84/18; H04M 88/06
  USPC ............................................ 455/556.1, 41.2
  See application file for complete search history.

(56) References Cited

U.S. PATENT DOCUMENTS

| 8,781,828 | B2* | 7/2014 | Park | G10L 15/26 341/176 |
| 2007/0238475 | A1* | 10/2007 | Goedken | H04M 1/7253 455/512 |
| 2008/0180228 | A1* | 7/2008 | Wakefield | G01S 5/0252 340/4.62 |
| 2008/0182516 | A1* | 7/2008 | Yamada | H04M 1/2535 455/41.2 |
| 2008/0214103 | A1* | 9/2008 | Nelson | H04M 1/22 455/3.06 |
| 2008/0292111 | A1* | 11/2008 | Park | H04R 1/1041 381/71.6 |
| 2008/0298606 | A1* | 12/2008 | Johnson | H04R 1/1091 381/74 |
| 2009/0172780 | A1* | 7/2009 | Sukeda | H04N 7/17318 726/3 |
| 2009/0303185 | A1* | 12/2009 | Larsen | H04M 1/7258 345/168 |
| 2010/0066677 | A1* | 3/2010 | Garrett | G06F 1/1626 345/163 |

(Continued)

FOREIGN PATENT DOCUMENTS

| KR | 2000-0075225 A | 12/2000 |
| KR | 2002-0095669 A | 12/2002 |
| KR | 2007-0076328 A | 7/2007 |

*Primary Examiner* — April G Gonzales
(74) *Attorney, Agent, or Firm* — Jefferson IP Law, LLP

(57) ABSTRACT

A method for connecting with an external device and an electronic device thereof are provided. The method includes determining whether an input for increasing a volume is received is determined while the volume of the electronic device is at a maximum value. If the input for increasing the volume is received, an external device is detected, the electronic device connects with the external device, and the external device outputs an output associated with a current function of the electronic device.

16 Claims, 14 Drawing Sheets

(56) References Cited

U.S. PATENT DOCUMENTS

| | | | |
|---|---|---|---|
| 2012/0110452 A1* | 5/2012 | Hiipakka | G06F 3/165 715/716 |
| 2013/0016040 A1* | 1/2013 | Ahn | G06F 1/1654 345/163 |
| 2013/0289983 A1* | 10/2013 | Park | G10L 15/26 704/235 |
| 2014/0037107 A1* | 2/2014 | Marino, Jr. | H03G 3/10 381/107 |
| 2014/0075311 A1* | 3/2014 | Boettcher | G06F 3/165 715/716 |

* cited by examiner

METHOD FOR CONNECTING WITH EXTERNAL DEVICE AND ELECTRONIC DEVICE THEREOF

CROSS-REFERENCE TO RELATED APPLICATION(S)

This application claims the benefit under 35 U.S.C. §119 (a) of a Korean patent application filed on Apr. 9, 2013 in the Korean Intellectual Property Office and assigned Serial number 10-2013-0038683, the entire disclosure of which is hereby incorporated by reference.

TECHNICAL FIELD

The present disclosure relates to an electronic device. More particularly, the present disclosure relates to a method for connecting with an external device in an electronic device, and the electronic device thereof.

BACKGROUND

Recently, as an electronic device such as a smartphone, a tablet Personal Computer (PC), etc. develops rapidly, an electronic device that enables wireless voice communication and information exchange has become a daily necessity. In early stages, the electronic device simply enabled wireless communication, but as a technology develops and the wireless Internet is introduced, the electronic device also evolves into a multimedia apparatus for performing functions such as schedule management, games, a remote controller, and capturing an image.

Particularly, an electronic device may perform a function provided by the electronic device via an external device by connecting the electronic device with the external device. For example, a smartphone may output a moving picture that is reproduced by a Television (TV) connected with the smartphone. For another example, a smartphone may output music reproduced by the smartphone via a speaker connected to the smartphone.

However, to connect an electronic device with an external device and perform a function of the electronic device via the external device, it is required to connect the electronic device with the external device by performing a plurality of procedures. For example, an electronic device determines a plurality of external devices detected via wireless communication, selects an external device to connect, and then performs a required pairing procedure, thereby connecting the electronic device with the external device, which is inconvenient.

Accordingly, a method for connecting an electronic device with an external device via a more convenient procedure without performing the plurality of above-described procedures, and performing a function of the electronic device via the connected external device needs to be provided.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and an apparatus for connecting with an external device in an electronic device.

Another aspect of the present disclosure is to provide a method and an apparatus for automatically connecting with an external device having a connection history with an electronic device.

Another aspect of the present disclosure is to provide a method and an apparatus for performing a function of an electronic device via a connected external device in the electronic device.

Another aspect of the present disclosure is to provide a method and an apparatus for adjusting a volume of a connected external device in an electronic device.

In accordance with an aspect of the present disclosure, a method for processing a function corresponding to a multi-touch in an electronic device is provided. The method includes determining whether a key input for increasing a volume is received while the volume of the electronic device is maximum, if the key input for increasing the volume is received, detecting an external device to connect with, connecting with the detected external device, and outputting an output associated with a current function of the electronic device via the connected external device.

In accordance with another aspect of the present disclosure, an apparatus for processing a function corresponding to a multi-touch in an electronic device is provided. The apparatus includes a processor, a touchscreen display, a communication system, and a memory, wherein the processor is configured to determine whether an input for increasing a volume is received while the volume of the electronic device is at a maximum value, if the key input for increasing the volume is received, to detect an external device to connect with, and to output an output associated with a current function of the electronic device via the connected external device.

Other aspects, advantages, and salient features of the disclosure will become apparent to those skilled in the art from the following detailed description, which, taken in conjunction with the annexed drawings, various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. Also, descriptions of well-known functions and constructions are omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure are provided for illustration purpose only and not for the purpose of limiting the present disclosure as defined by the appended claims and their equivalents.

In the following description, the electronic device includes a mobile communication terminal, a smartphone, a tablet Personal Computer (PC), a digital camera, an MP3 player, a navigation, a laptop computer, a netbook, a computer, a television, a refrigerator, and an air conditioner that enable wireless communication.

Figure 1A:
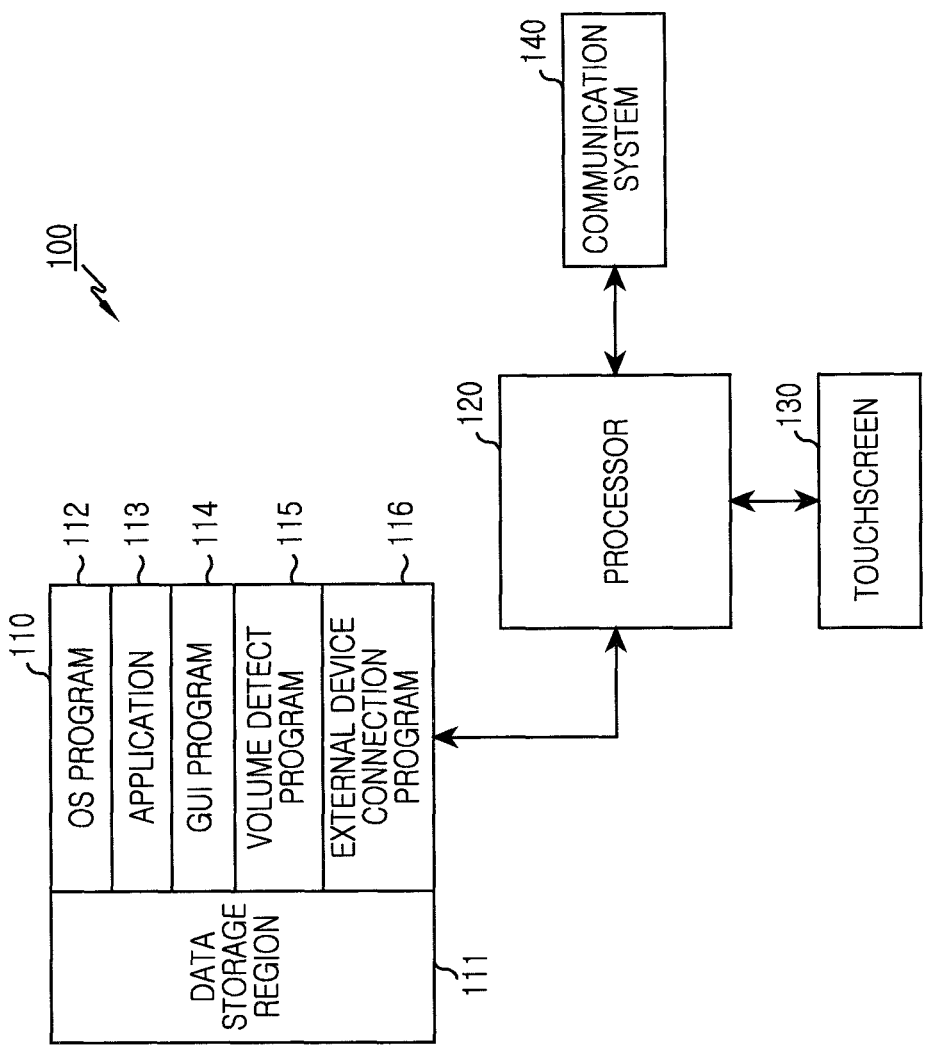
FIG. 1A is a block diagram illustrating an electronic device for connecting with an external device according to an embodiment of the present disclosure.

FIG. 1A is a block diagram illustrating an electronic device for connecting with an external device according to an embodiment of the present disclosure.

Referring to FIG. 1A, the electronic device 100 includes a memory 110, a processor 120, a touchscreen 130, and a communication system 140. A plurality of memories 110 and processors 120 may be provided.

The memory 110 includes a data storage region 111, an Operating System (OS) program 112, an application 113, a Graphic User Interface (GUI) program 114, a volume detect program 115, an external device connection program 116, etc. Also, a program, which is a software element that may be expressed as a set of instructions, may be referred to as an instruction set. A program may be also expressed as a module.

The memory 110 may store one or more programs including instructions for performing an embodiment of the present disclosure.

The data storage region 111 stores data occurring while a function corresponding to a program is performed. The data storage region 111 according to the present disclosure may store a history representing the electronic device 100 and an external device that the electronic device 100 has connected with. For example, the data storage 111 may store that the electronic device 100 and a first radio have been connected. In another example, the data storage region 111 may store that the electronic device 100 and a first TeleVision (TV) have been connected.

In addition, the data storage region 111 may store a final volume value for each external apparatus having a history that the external apparatus was connected before. In other words, the data storage region 111 may determine the volume of an external device connected with the electronic device 100, and in the case where the connection with the external device ends, the data storage region 111 may map volume information determined last to a relevant external device and store the same.

In addition, the data storage 111 may store the number of times a volume key input is required for detecting an external device while the volume of the electronic device 100 is at a maximum value. For example, the data storage 111 may store that a key input for increasing a volume is required to be input three times to detect an external device while the volume is at a maximum value. In another example, the data storage 111 may store that a key input for increasing a volume is required five times to detect an external device while the volume is at a maximum value.

In addition, the data storage 111 may store a volume key input time that is required for detecting an external device while the volume of the electronic device 100 is maximum. For example, the data storage 111 may store that a key input for increasing the volume should be maintained for two seconds or more to detect an external device while the volume is at a maximum value. In another example, the data storage 111 may store that a key input for increasing the volume should be maintained for three seconds or more to detect an external device while the volume is at a maximum value.

In addition, the data storage region 111 may map a subdivided volume of the electronic device 100 to a volume of an external device and store the same. In other words, the data storage 111 may subdivide the subdivided volume region of the electronic device 100 and the volume region of the external device into the same steps, and then map respective steps and store the same. For example, in the case where the volume region of the electronic device 100 is subdivided into seven steps, the data storage 111 may subdivide the volume region of the external device into seven steps, and map the volume for each step to store the same.

The OS program 112 (for example, WINDOWS®, LINUX, Darwin, RTXC, UNIX, OS X®, or a built-in OS such as VxWorks) includes various software elements for controlling a general system operation. For example, control of the general system operation denotes memory management and control, storage hardware (device) control and management, power control and management, etc. The OS program 112 performs communication functions between various hardware devices and software elements (programs, modules, etc.).

The application 113 includes any application such as a browser, an e-mail, a message, word processing, an address book, a widget, Digital Right Management (DRM) module, a voice recognition module, a voice duplication module, a position determining function, a location based service, and a telephone application.

The GUI program 114 includes at least one software element for providing a user interface for displaying graphics and receiving inputs on the electronic device 100. That is, the GUI program 114 includes at least one software element for displaying user interface information on the touchscreen 130. According to the present disclosure, the GUI program 114 includes an instruction for displaying a graphic element corresponding to a function that is being performed by the electronic device 100. For example, the GUI program 114 includes an instruction for displaying a first moving picture in the case where the first moving picture is being viewed by a user. In another example, the GUI program 114 includes an instruction for displaying a first image in the case where the first image is being displayed by a user.

In addition, in the case where at least one external device is detected via wireless communication, the GUI program 114 includes an instruction for displaying a list of detected external devices. For example, the GUI program 114 may display a list of external devices such as a first radio and a first TV that are detected via wireless communication.

In the case where a key input via an external key provided to the electronic device 100 is received, the volume detect program 115 may adjust the volume of the electronic device 100 in response to the relevant input. Specifically, in the case where the volume key (e.g., a button) provided to the outside of the electronic device 100 is pressed, the volume detect program 115 may adjust the volume of the electronic device 100 in response. For example, in the case where a key input for increasing the volume is received from external keys in the electronic device 100, the volume detect program 115 may increase the volume of the electronic device 100. For another example, in the case where a key input for reducing the volume is received from the external keys in the electronic device 100, the volume detect program 115 may reduce the volume of the electronic device 100.

In addition, in the case where the volume of the electronic device 100 is at a maximum value, the volume detect program 115 may detect an external device by determining whether the key input for increasing the volume is input a preset number of times. In other words, in the case where the key input is detected by the preset number of times while the volume of the electronic device 100 is at the maximum value, the volume detect program 115 detects an external device that is connectable via wireless communication. For example, in the case where a key input for increasing the volume is detected three times while the volume of the electronic device 100 is at a maximum value, the volume detect program 115 may detect an external device via wireless communication.

In addition, in the case where the volume of the electronic device 100 is at a maximum value, the volume detect program 115 may detect an external device by determining if the key input for increasing the volume is maintained for a preset time stored in advance. In other words, in the case where the key input is maintained for the preset time stored in advance while the volume of the electronic device 100 is at a maximum value, the volume detect program 115 detects an external device that is connectable via wireless communication. For example, in the case where the key input for increasing the volume is maintained for three seconds while the volume of the electronic device 100 is at a maximum value, the volume detect program 115 may detect an external device via wireless communication.

In the case where at least one external device is detected by the volume detect program 115, the external device connection program 116 may display a list of external devices including the detected at least one external device. For example, in the case where a first radio and a first TV are detected by the volume detect program 115, the external device connection program 116 may display a list of external devices including the first radio and a second TV. At this point, in the case where an external device is selected, the external device connection program 116 may perform communication connection with a selected external device. In the case where the key input for increasing the volume is input a preset number of times or for a preset time while the volume is at a maximum value but wireless communication of the electronic device 100 is not connected, the external device connection program 116 may display a list of wireless communications that are currently connectable in the electronic device 100. At this point, the external device connection program 116 may detect an external device via wireless communication selected by a user control.

In addition, when detecting an external device having a connection history from the detected one or more external devices, the external device connection program 116 may automatically connect with the external device with the connection history via wireless communication without displaying the external device list. In case of detecting a plurality of external devices having a connection history, the external device connection program 116 may automatically connect with an external device having the highest priority according to a preset priority. Here, the priority may be at least one of a ranking according to the number of times which an external device is connected with the electronic device 100, a ranking according to an external device that is most recently connected with an electronic device 100, a ranking set in advance during a design stage, and a ranking set by a user control. In the case where the connection cannot be formed with an external device having a connection history, the external device connection program 116 may try connection with an external device corresponding to the next order of priority.

In addition, in the case where connection with an external device is performed via wireless communication, the external device connection program 116 may perform a function that is currently being performed by the electronic device 100 via the connected external device. In other words, the external device connection program 116 allows a connected external device to perform the current function of the electronic device 100 by transmitting the current function to the connected external device in real-time. For example, in the case where a moving picture is currently reproduced by the electronic device 100, the external device connection program 116 may reproduce the moving picture via a connected TV. For another example, in the case where music is currently reproduced by the electronic device 100, the external device connection program 116 may reproduce the music via a connected radio. For still another example, in the case where an image is currently displayed by the electronic device 100, the external device connection program 116 may display the image via a connected TV.

In addition, in case of having to output a sound (an audio signal) via an external device, the external device connection program 116 may output a sound at a volume that will not damage a user's hearing. For example, in case of having to output a sound via an external device, the external device connection program 116 may output a sound at a predetermined volume. At this point, the volume may be set in advance at a design stage or changed by a user control. In another example, in case of having to output a sound via an external device, the external device connection program 116 may determine whether the external device has a connection history with the electronic device 100, and when the external device has a connection history with the electronic device 100, the external device connection program 116 may output a volume set at the end of the previous connection with the electronic device 100. When the electronic device 100 is connected with an external device, the external device connection program 116 periodically determines the volume of the external device and stores the same.

In addition, the external device connection program 116 may adjust a volume output via the external device by adjusting the volume of the electronic device 100. The external device connection program 116 may subdivide the entire volume of the electronic device 100 into a plurality of steps and then subdivide the entire volume of a connected external device into the same steps as those of the volume of the electronic device 100 to map respective steps of the volume and store and manage the same. For example, in the case where the entire volume of the electronic device 100 is subdivided into ten steps, the external device connection program 116 may subdivide the entire volume of a connected external device into ten steps to map respective steps of the volume. Accordingly, in the case where the volume of the electronic device 100 is increased by 1 step, the volume of the connected external device may be also increased by 1 step.

Though not shown, the processor 120 may include at least one processor and a peripheral interface. Also, the processor 120 may execute a specific program (an instruction set) stored in the memory 110 to perform specific functions of the program.

The touchscreen 130 is a touch-sensitive display and provides an interface for a touch input/output between the electronic device 100 and a user. The touchscreen 130 is a medium for detecting a touch (or a contact) via a touch sensor (not shown), transferring a detected touch input to the electronic device 100, and providing a visual output from the electronic device 100 to the user. That is, the touchscreen 130 provides a visual output based on text, graphics, and a video to the user, in response to a touch input.

The touchscreen 130 includes a touch detect surface for detecting a user's touch input to detect a haptic contact, a tactile contact, or the user's touch input by a combination of these. For example, a touch detect point of the touchscreen 130 corresponds to a digit of a finger used for a contact for the touch detect surface. Also, the touchscreen 130 detects a contact by an external device such as a stylus pen, etc. via the touch detect surface. The detected contact may be converted to an information corresponding to a user interface object (for example, a soft key) displayed on the touchscreen.

The touchscreen 130 may use various display technologies such as a Liquid Crystal Display (LCD), a Light Emitting Diode (LED), a Light Emitting Polymer Display (LPD), an Organic Light Emitting Diode (OLED), an Active Matrix Organic Light Emitting Diode (AMOLED), or a Flexible LED (FLED), etc. The touchscreen 130 of the present disclosure is not limited to a touchscreen using these display technologies. Also, the touchscreen 130 may detect a start of a contact, a movement of a contact, or a stop or an end of a contact on the touch detect surface using various touch (or sensing) technologies such as capacitive detection, resistive detection, infrared detection, or surface acoustic wave detection technologies. The touchscreen 130 according to the present disclosure may detect a touch for displayed data. In addition, the touchscreen 130 may display graphics representing the volume of the electronic device 100. For example, the touchscreen 130 may display the volume of the electronic device 100 in the form of a progress bar.

In addition, the touchscreen 130 may display a list of external devices detected via wireless communication. At this point, the list of external devices may be displayed in the form of a message such as a popup, etc.

In addition, in the case where the touchscreen 130 is connected with an external device via wireless communication, the touchscreen 130 may display information of a connected external device. For example, the touchscreen 130 may display an ID of the external device connected via wireless communication in the form of a popup.

The communication system 140 may include radio frequency (RF) receiver and transmitter, and/or light (for example, an infrared) receiver and transceiver. For example, the communication system 140 may include a communication system for supporting one of a Global System for Mobile Communication (GSM) network, an Enhanced Data GSM Environment (EDGE) network, a Code Division Multiple Access (CDMA) network, a Wide-CDMA (W-CDMA) network, a Long Term Evolution (LTE) network, an Orthogonal Frequency Division Multiple Access (OFDMA) network, a Wireless Fidelity (Wi-Fi) network, a Near Field Communication (NFC) network, an Infrared Data Association (IrDA), a Worldwide interoperability for Microwave Access (WiMax) network and/or a Bluetooth network. A communication system according to an embodiment of the present disclosure is not limited to a communication system for supporting the above-described network, but may be a communication system supporting another network. According to the present disclosure, in the case where a key input for increasing a volume is input by a preset number of times or for a preset time while the volume is at a maximum, the communication system 140 may detect a connectable external device that is currently connected to the communication system 140. In addition, in the case where a specific external device is selected by the external device connection program 116, the communication system 140 may connect with the selected external device via the network currently connected to the communication system 140.

Figure 1B:
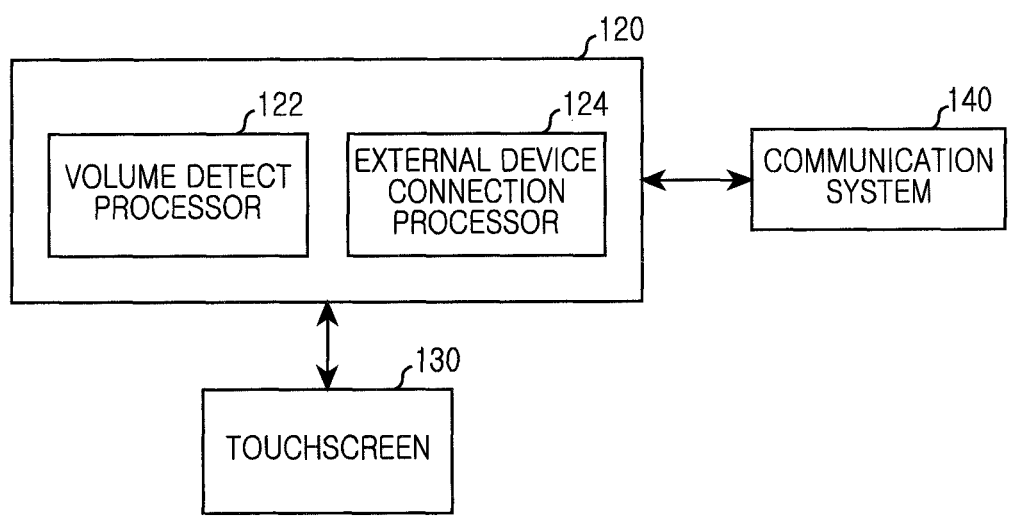
FIG. 1B is a block diagram illustrating a processor for connecting with an external device according to an embodiment of the present disclosure.

FIG. 1B is a block diagram illustrating a processor for connecting with an external device according to an embodiment of the present disclosure.

Referring to FIG. 1B, the processor includes a volume detect processor 122 and an external device connection processor 124.

In the case where a key input is received, the volume detect processor 122 may adjust the volume of the electronic device 100 in response. Specifically, in the case where a volume key (button) on the electronic device 100 is pressed, the volume detect processor 122 may adjust the volume of the electronic device 100 in response. For example, in the case where a key input for increasing the volume is received, the volume detect processor 122 may increase the volume of the electronic device 100. In another example, in the case where a key input for reducing the volume is received, the volume detect processor 122 may reduce the volume of the electronic device 100.

In addition, in the case where the volume of the electronic device 100 is maximum, the volume detect processor 122 may detect a request to connect to an external device if the key input for increasing the volume is input a preset number of times. In other words, in the case where the key input is detected a preset number of times while the volume of the electronic device 100 is at a maximum value, the processor 122 detects a connectable external device via wireless communication. For example, in the case where the key input for increasing the volume is detected three times while the volume of the electronic device 100 is at a maximum value, the volume detect program 115 may detect an external device via wireless communication.

In addition, in the case where the volume of the electronic device 100 is at a maximum value, the volume detect processor 122 may detect an external device by determining whether the key input is maintained for a preset time. In other words, in the case where the key input is maintained the preset time while the volume of the electronic device 100 is at a maximum value, the volume detect processor 122 detects a connectable external device via wireless communication. For example, in the case where the key input is maintained for three seconds while the volume of the electronic device 100 is at a maximum value, the volume detect processor 122 may detect an external device via wireless communication.

In the case where at least one external device is detected by the volume detect processor 122, the external device connection processor 124 may display a list of external devices including the at least one external device. For example, in the case where a first radio and a first TV are detected by the volume detect processor 122, the external device connection processor 124 may display a list of external devices including the first radio and a second TV. At this point, in the case where an external device displayed on the list is selected, the external device connection processor 124 may connect with the selected external device to perform communication. In the case where the key is input a preset number of times or for the preset time while the volume is at a maximum value, but wireless communication of the electronic device 100 is not connected, the external device connection processor 124 may display a list of devices that may be connected with the electronic device 100. At this point, the external device connection processor 124 may detect an external device via wireless communication selected by a user control.

In addition, when an external device with a connection is detected from one or more external devices, the external device connection processor 124 may automatically connect with the external device with the connection history via wireless communication without displaying the external devices. At this point, in case of detecting a plurality of external devices each having a connection history, the external device connection processor 124 may automatically connect with an external device having a highest priority set in advance. Here, the priority may be at least one of a ranking according to which the number of times that the external device has connected with the electronic device 100, a ranking according to which the external device has connected with an electronic device 100 most recently, a ranking set in advance during a design stage, and a ranking set by a user control. In the case where a connection cannot be formed with an external device having a connection history, the external device connection processor 124 may try connection with an external device corresponding to the next order of priority.

In addition, in the case where connection with an external device is performed via wireless communication, the external device connection processor 124 may perform a function that is currently being performed by the electronic device 100 via the connected external device. In other words, the external device connection processor 124 allows the connected external device to perform the current function of the electronic device 100 by transmitting the current function to the connected external device in real-time. For example, in the case where a moving picture is currently reproduced by the electronic device 100, the external device connection processor 124 may reproduce the moving picture via a connected TV. In another example, in the case where music is currently reproduced by the electronic device 100, the external device connection processor 124 may reproduce the music via a connected radio. In still another example, in the case where an image is currently displayed by the electronic device 100, the external device connection processor 124 may display the image via a connected TV.

In addition, in the case of having to output a sound (an audio signal) via an external device, the external device connection processor 124 may output a sound at a volume that will not damage a user's hearing. For example, in the case of having to output a sound via an external device, the external device connection processor 124 may output a sound at a predetermined volume. At this point, the volume may be preset at a design stage or may be changed by a user control. In another example, in case of having to output a sound via an external device, the external device connection processor 124 may determine whether a currently connected external device includes a connection history with the electronic device 100, and when the connection history exists, the external device connection processor 124 may output a volume set at the end of the previous connection with the electronic device 100. When the electronic device 100 is connected with an external device, the external device connection processor 124 periodically determines the volume of the external device and stores the same.

In addition, the external device connection processor 124 may adjust a volume output via the external device by adjusting the volume of the electronic device 100. The external device connection processor 124 may subdivide the entire volume of the electronic device 100 into a plurality of steps and subdivide the entire volume of a connected external device into the same steps as those of the volume of the electronic device 100 to map respective steps of the volume and store and manage the same. For example, in the case where the entire volume of the electronic device 100 is subdivided into ten steps, the external device connection processor 124 may subdivide the entire volume of a connected external device into ten steps to map respective steps of the volume. Accordingly, in the case where the volume of the electronic device 100 is increased by 1 step, the volume of the connected external device may be also increased by 1 step.

Figure 2A:
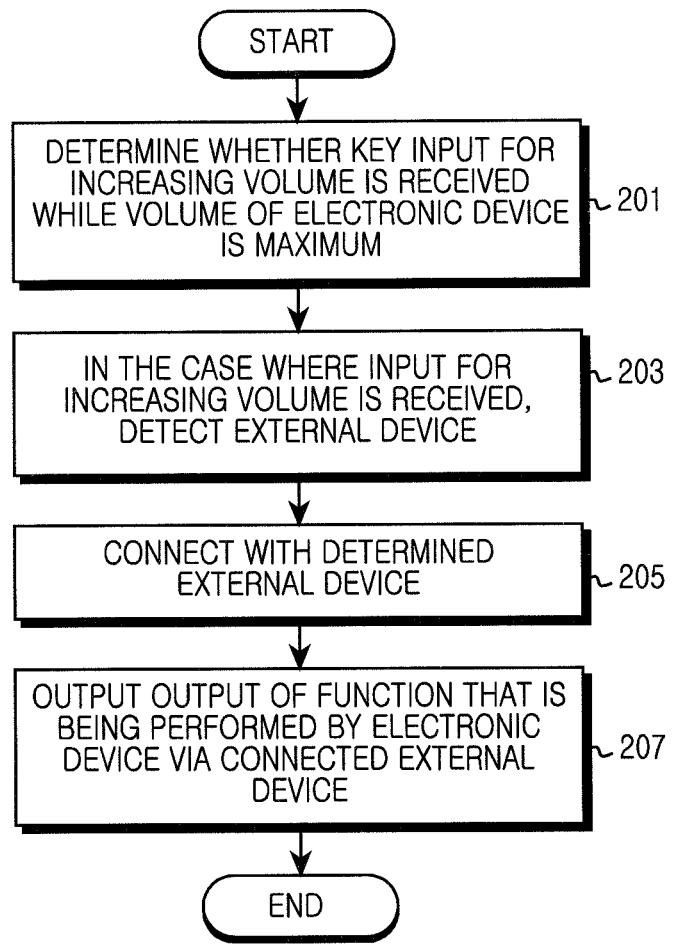
FIG. 2A is a flowchart illustrating a procedure for performing a function of an electronic device via an external device in the electronic device according to an embodiment of the present disclosure.

FIG. 2A is a flowchart illustrating a procedure for performing a function of an electronic device via an external device in the electronic device according to an embodiment of the present disclosure.

Referring to FIG. 2A, the electronic device 100 determines whether an input for increasing the volume of the electronic device 100 is received in operation 201. For example, the electronic device 100 determines whether a key input for increasing the volume is input a preset number of times while the volume is at a maximum value. In another example, the electronic device 100 determines whether the key input for increasing the volume is maintained for a preset time while the volume is at a maximum value.

After that, the electronic device 100 determines an external device to connect with in the case where the key input for increasing the volume is received in operation 203. At this point, the electronic device 100 may detect the external device and then determine the external device determined or detected in advance. For example, in the case where an input for increasing the volume is received, the electronic device 100 may detect an external device and determine the detected external device. For another example, in the case where an input for increasing the volume is received while an external device is detected in advance, the electronic device 100 may determine at least one external device detected in advance.

After that, the electronic device 100 proceeds to operation 205 to connect with the determined external device. At this point, in the case where a plurality of determined external devices exist, the electronic device may connect with a selected external device according to a user control or connect with an external device determined according to the order of priority wireless communication.

After that, the electronic device may proceed to operation 207 to output an output of a function that is currently being performed by the electronic device via the connected external device. For example, in the case where a moving picture is currently reproduced by the electronic device 100, the electronic device 100 may reproduce the moving picture via a connected TV. In another example, in the case where music is currently reproduced by the electronic device 100, the electronic device 100 may reproduce the music via a connected radio. In still another example, in the case where an image is currently displayed by the electronic device 100, the electronic device 100 may via a connected TV.

Figure 2B:
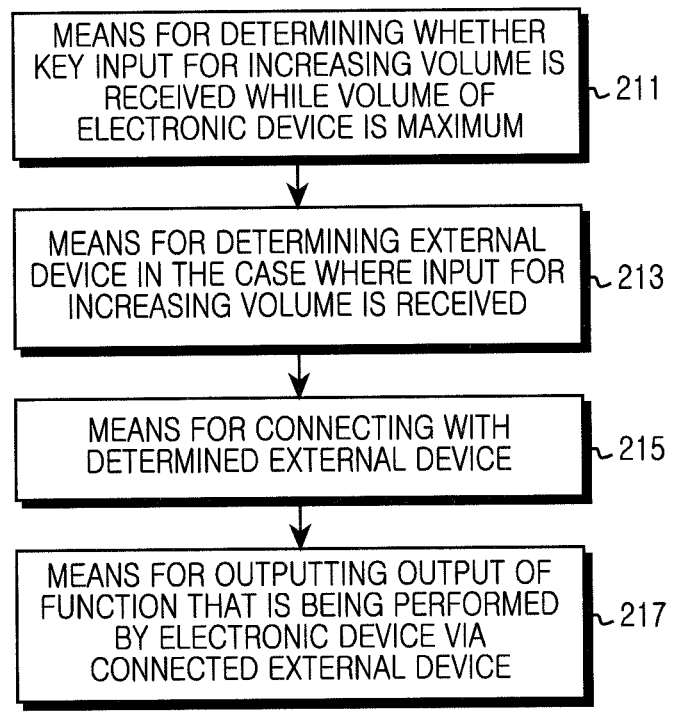
FIG. 2B is a view illustrating means for performing a function of an electronic device via an external device in the electronic device according to an embodiment of the present disclosure.

FIG. 2B is a view illustrating means for performing a function of an electronic device via an external device in the electronic device according to an embodiment of the present disclosure.

Referring to FIG. 2B, the electronic device 100 includes means 211 for determining whether an input for increasing the volume of the electronic device 100 is received. At this point, the electronic device 100 may include one or more keys (buttons) for volume adjustment on the electronic device 100.

In addition, in the case where an input for increasing the volume is received, the electronic device 100 includes means 213 for determining an external device. At this point, the electronic device 100 may support at least one wireless communication.

In addition, the electronic device 100 includes means 215 for connecting with a determined external device and means 217 for outputting an output of a function that is currently being performed by the electronic device 100 via the connected external device. At this point, the external device may be at least one of a mobile communication terminal, a smartphone, a tablet PC, a digital camera, an MP3 player, a navigation, a laptop computer, a netbook, a computer, a television, a refrigerator, and an air conditioner that support at least one wireless communication.

Figure 3:
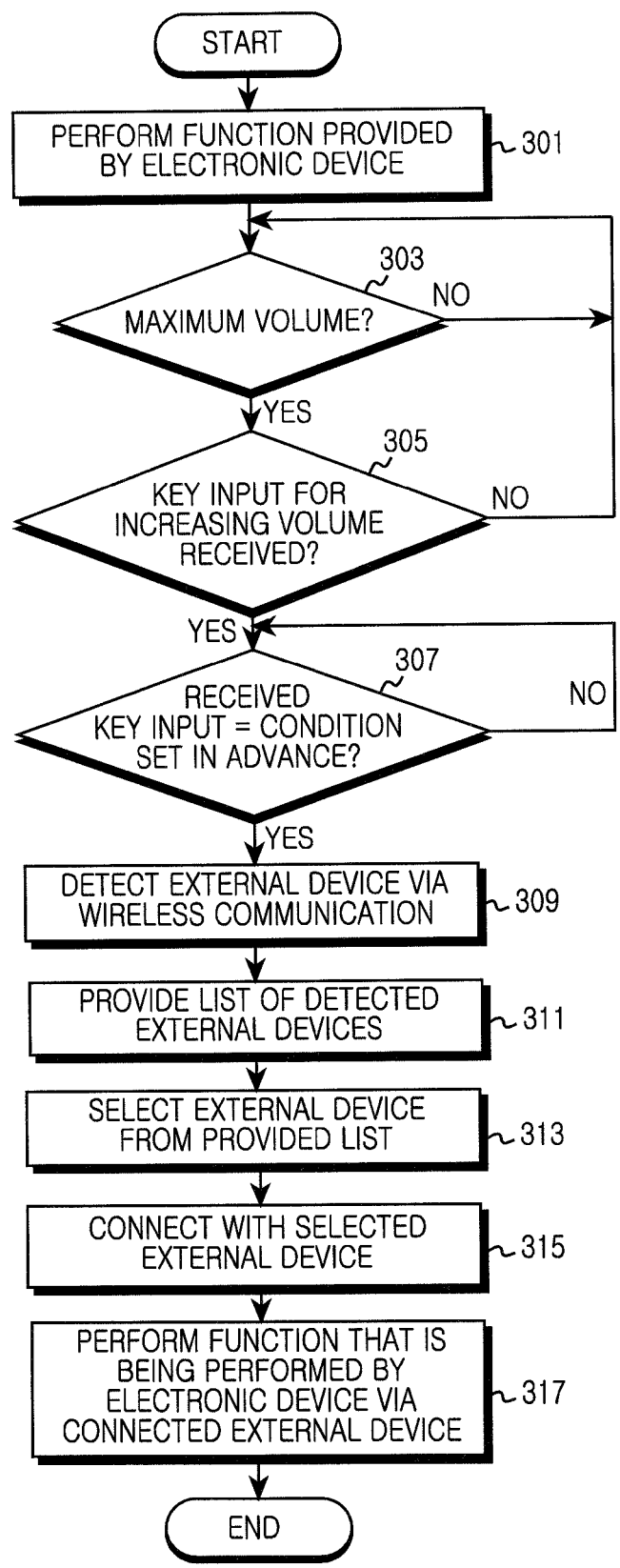
FIG. 3 is a flowchart illustrating a procedure for outputting contents stored in an electronic device via a connected external device in the electronic device according to an embodiment of the present disclosure.

FIG. 3 is a flowchart illustrating a procedure for outputting contents stored in an electronic device via a connected external device in the electronic device according to an embodiment of the present disclosure.

Referring to FIG. 3, the electronic device performs a function provided by the electronic device 100 in operation 301. For example, the electronic device 100 may reproduce music stored in the electronic device 100. For still another example, the electronic device 100 may reproduce music that is being reproduced via a streaming service.

In operation 303, the electronic device 100 determines whether the volume is at a maximum.

In the case where the volume is not at a maximum, the electronic device 100 returns to operation 303 to re-perform subsequent operations.

However, in the case where the volume of the electronic device 100 is at a maximum, the electronic device 100 proceeds to operation 305 to determine whether a key input for increasing the volume is received. In other words, the electronic device 100 determines whether the key input for increasing the volume is additionally received while the volume of the electronic device is at a maximum.

In the case where the key input for increasing the volume is not received, the electronic device 100 returns back to operation 303 until a key input for increasing the volume is received.

However, in the case where the key input for increasing the volume is received, the electronic device 100 proceeds to operation 307 to determine whether the received key input coincides with a preset condition set. The preset condition may be a preset number of key inputs or a key input maintain time. For example, in the case where the volume of the electronic device 100 is at a maximum, the electronic device 100 determines whether the key input for increasing the volume is input a preset number of times stored in advance. In another example, in the case where the volume of the electronic device 100 is at a maximum, the electronic device 100 determines whether the key input for increasing the volume is maintained for a preset time.

If the preset condition is met in operation 307, the electronic device may detect an external device via wireless communication in operation 309. At this point, in the case where the electronic device 100 is not connected to wireless communication network, the electronic device 100 provides a list representing wireless communication networks that are currently connectable to the electronic device 100 and may connect to a selected wireless communication network under a user control.

After that, the electronic device 100 proceeds to operation 311 to provide a list of detected external devices and then proceeds to operation 313 to select an external device from the provided list. In other words, the electronic device 100 displays a list of external devices including at least one external device detected via wireless communication and selects an external device under a user control.

After that, the electronic device 100 proceeds to operation 315 to connect with the selected external device. In other words, the electronic device 100 connects with the selected external device via the wireless communication. In case of detecting an external device having a connection history with the electronic device 100 from the one or more external devices detected via the wireless communication, the electronic device 100 may automatically connect with the external device with the connection history without displaying the list of the external devices. At this point, in case of detecting a plurality of external devices each having a connection history, the electronic device 100 may automatically connect with an external device according to the highest priority. In the case where a connection cannot be formed with an external device with a connection history, the electronic device 100 may try connection with an external device corresponding to the next order of priority.

After that, the electronic device 100 proceeds to operation 317 to perform a function that is currently being performed by the electronic device 100 via a connected external device. In other words, the electronic device 100 allows the connected external device to perform the function of the electronic device 100 by transmitting the current function to the connected external device in real-time.

Figure 4A:
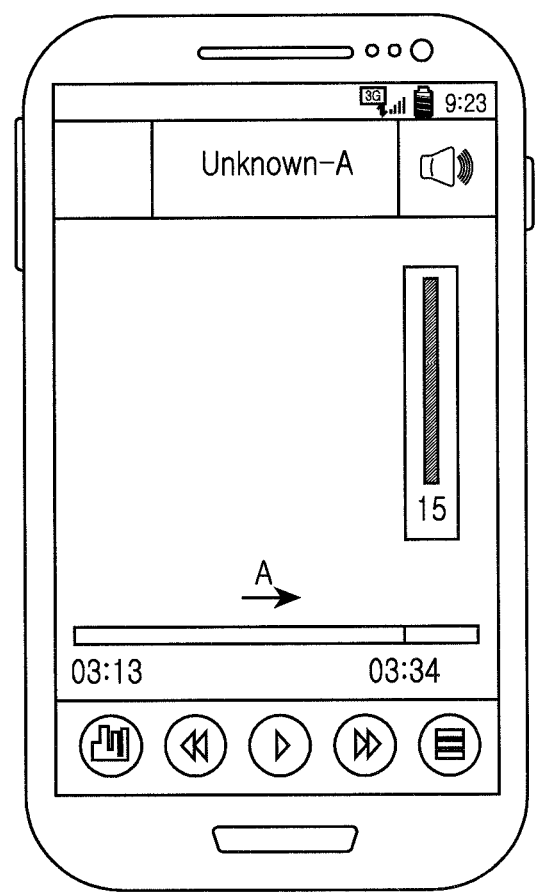
FIGS. 4A, 4B, and 4C are views illustrating an example of outputting music stored in an electronic device via a connected radio in the electronic device according to an embodiment of the present disclosure.
Figure 4B:
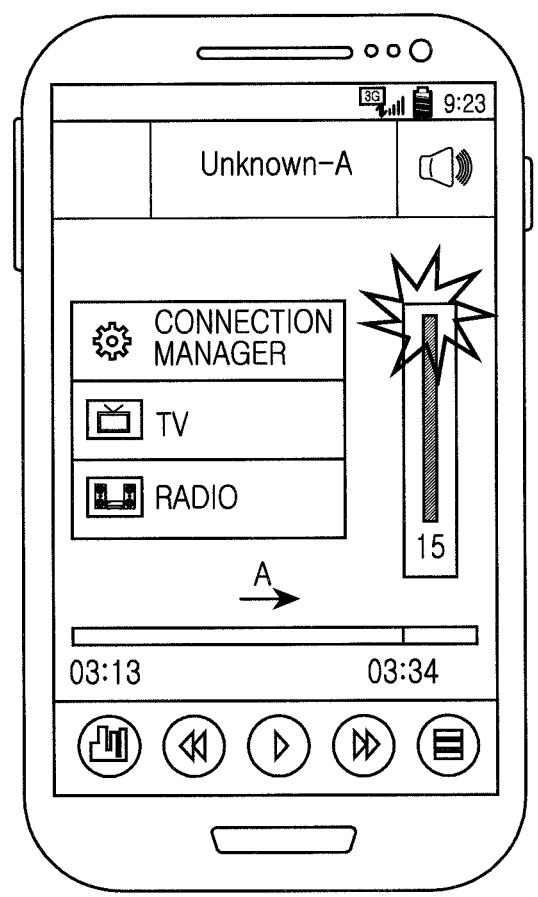
Figure 4C:
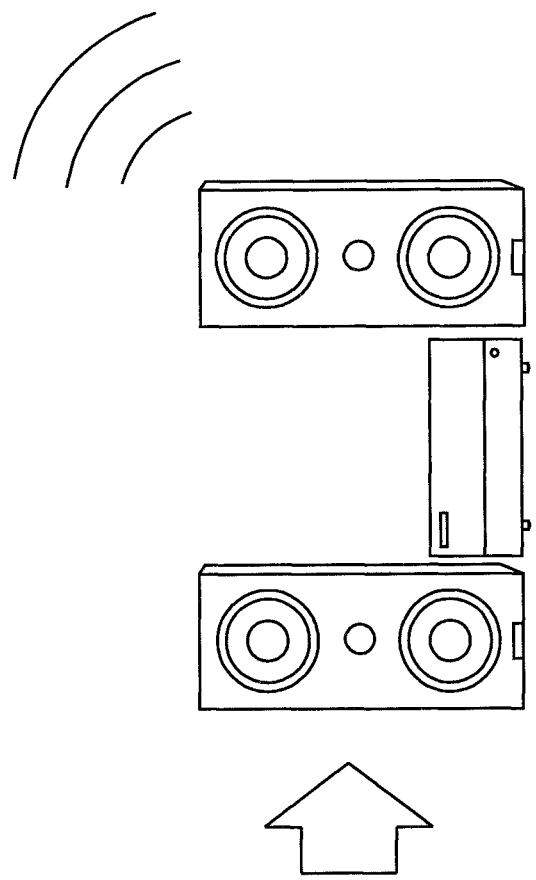
Figure 4C:
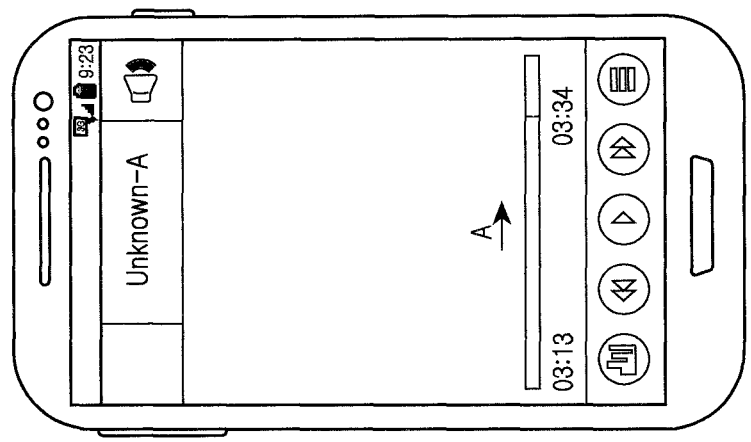

FIGS. 4A, 4B, and 4C are views illustrating an example of outputting music stored in an electronic device via a connected radio in the electronic device according to an embodiment of the present disclosure.

For example, as illustrated in FIG. 4A, in the case where a key input is detected by the preset number of times while the volume is at a maximum, the electronic device 100 detects external devices connectable via wireless communication, and as illustrated in FIG. 4B, displays a list of external devices including detected TV and radio. At this point, in the case where a radio is selected from the displayed list of external devices, the electronic device 100, as illustrated in FIG. 4C, may reproduce music that is being reproduced by the electronic device 100 via the connected radio. At this point, the electronic device 100 may output the music via only the connected radio or output the music via the electronic device 100 and the radio, simultaneously.

Figure 5A:
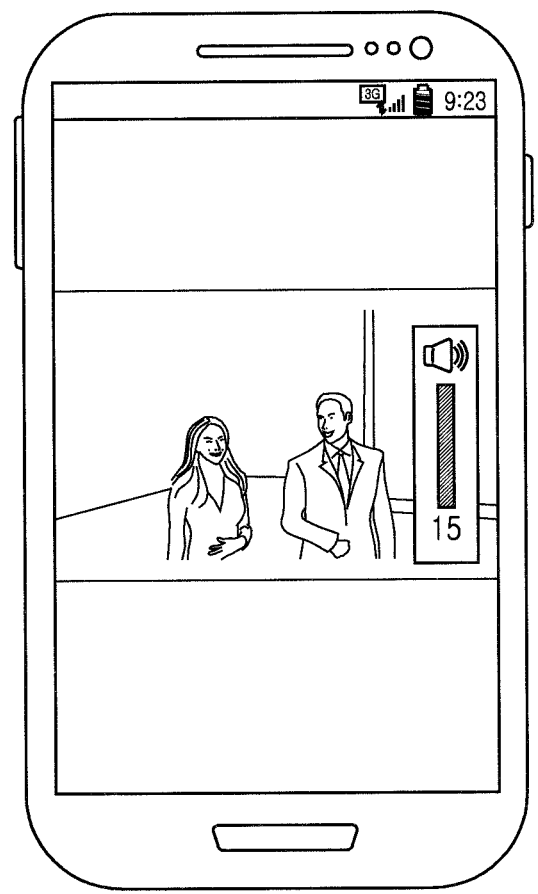
FIGS. 5A, 5B, and 5C are views illustrating an example of outputting a moving picture stored in an electronic device via a connected TV in the electronic device according to an embodiment of the present disclosure.
Figure 5B:
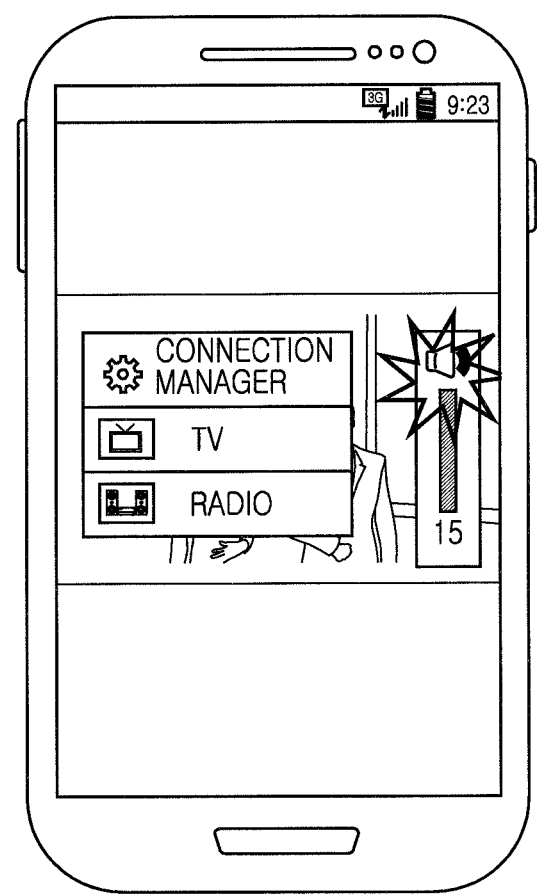
Figure 5C:
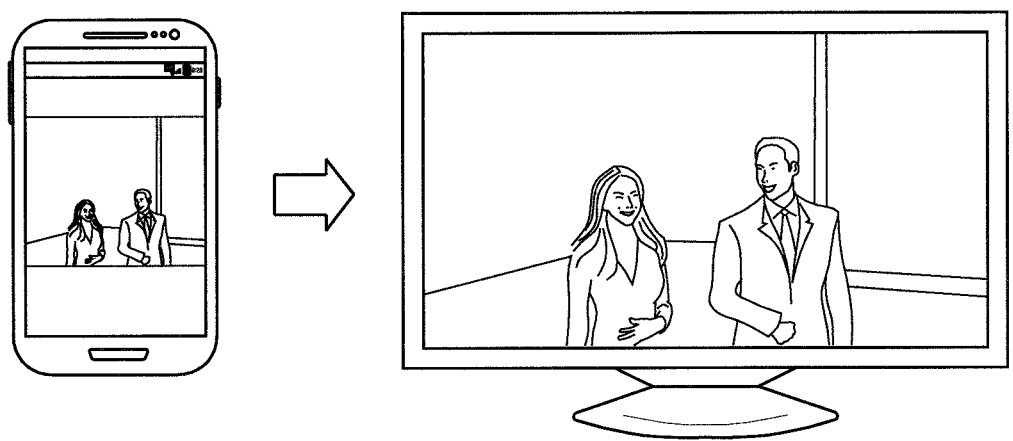

FIGS. 5A, 5B, and 5C are views illustrating an example of outputting a moving picture stored in an electronic device via a connected TV in the electronic device according to an embodiment of the present disclosure.

In another example, as illustrated in FIG. 5A, in the case where a key input is maintained for a preset time while the volume is at a maximum, the electronic device 100 detects external devices connectable via wireless communication, and as illustrated in FIG. 5B, displays a list of external devices including detected TV and radio. At this point, in the case where a TV is selected from the displayed list of external devices, the electronic device 100, as illustrated in FIG. 5C, may reproduce a moving picture via the connected TV.

Figure 6A:
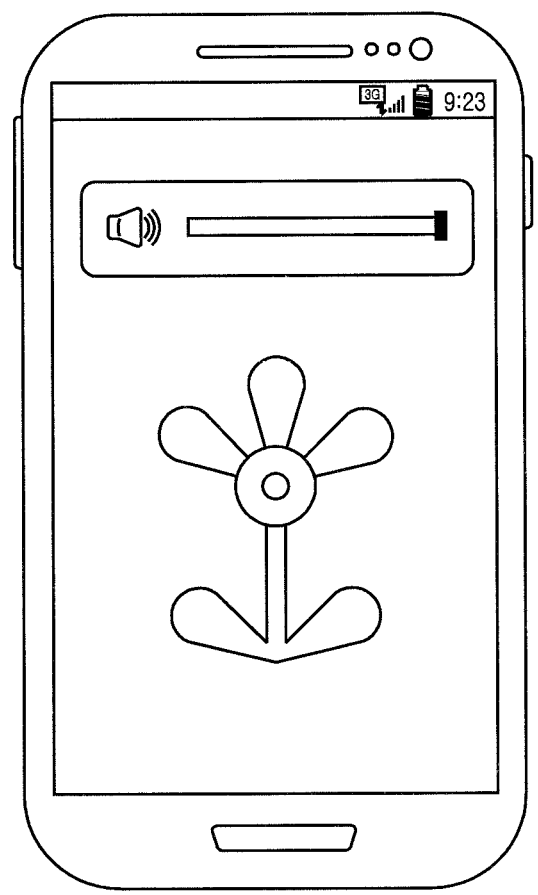
FIGS. 6A, 6B, and 6C are views illustrating an example of outputting an image stored in an electronic device via a connected TV in the electronic device according to an embodiment of the present disclosure.
Figure 6B:
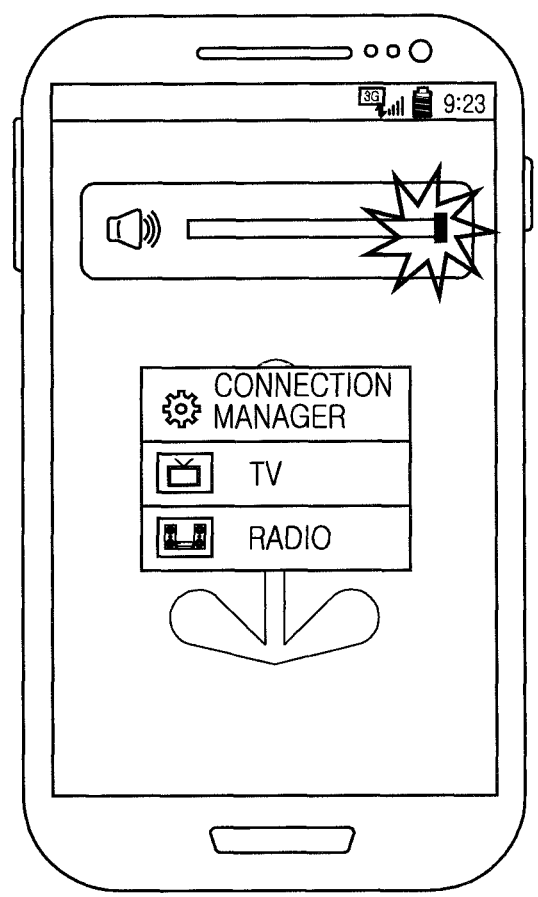
Figure 6C:
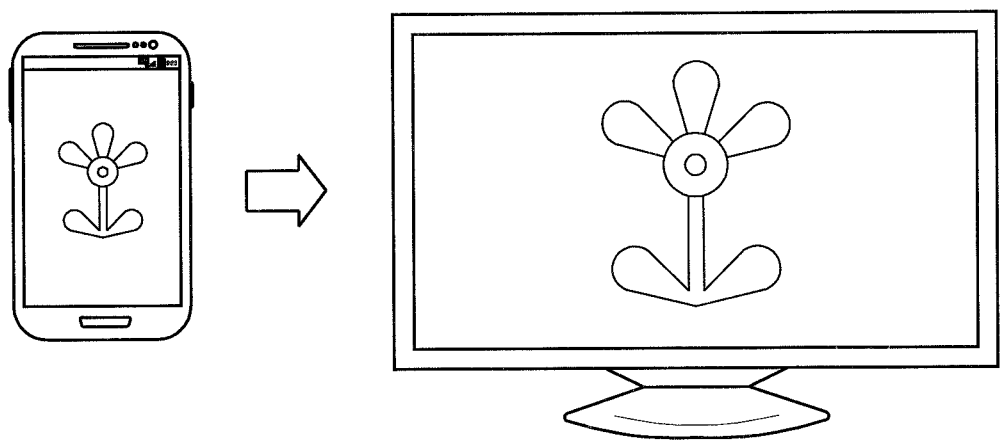

FIGS. 6A, 6B, and 6C are views illustrating an example of outputting an image stored in an electronic device via a connected TV in the electronic device according to an embodiment of the present disclosure.

For still another example, as illustrated in FIG. 6A, in the case where a key input is detected by the preset number of times while the volume is at a maximum, the electronic device 100 detects external devices connectable via wireless communication, and as illustrated in FIG. 6B, displays a list of external devices including detected TV and radio. At this point, in the case where a TV is selected from the displayed list of external devices, the electronic device 100, as illustrated in FIG. 6C, may display an image via the connected TV. After that, the electronic device 100 ends a procedure according to an embodiment of the present disclosure.

According to the present disclosure, in the case where a key input for increasing a volume is received by a preset condition while the volume of the electronic device is at a maximum, the electronic device may detect an external device to connect via wireless communication and then perform a function that is being performed by the electronic device via a connected external device, thereby controlling the external device to perform the function that is being performed by the electronic device.

Various embodiments of the present disclosure and all functional operations described in the present specification may be performed by structures disclosed by the present specification, a computer software including equivalent structures of these, a firmware, or a hardware, or a combination of one or more of these. Also, the various embodiments of the present disclosure described in the present specification may be performed by one or more computer program products, that is, a data processing device, or one or more modules of computer program instructions encoded on a computer-readable medium for controlling an operation of this device.

A computer-readable medium may be a machine readable storage medium, a machine readable storage substrate, a memory device, a configuration of a material having an influence on a machine readable radio wave stream, or a combination of one or more of these. A terminology of a data processing device includes, for example, a programmable processor, a computer, or all apparatuses, devices, and machines for processing data including a multiple processor or a computer. The apparatuses may include a code for generating an execution environment for a relevant computer program in addition to hardware, for example, a processor firmware, a protocol stack, a database management system, an operating system, or a code forming a combination of one or more of these.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for controlling an electronic device, the method comprising:
   receiving an input for increasing an audio volume level of the electronic device;
   determining whether to connect with an external device, based on the audio volume level and a maximum audio volume level of the electronic device when the input is received;
   connecting with the external device based on the determination; and
   outputting an audio output of the electronic device via the connected external device.

2. The method of claim 1, wherein the determining whether to connect with an external device, based on the audio volume level and a maximum audio volume level of the electronic device comprises:
   determining whether the audio volume level is the maximum audio volume level before the receiving the input.

3. The method of claim 1, wherein the connecting with the external device based on the determination comprises:
   identifying the external device to be connectable with the electronic device.

4. The method of claim 3, wherein the connecting with the external device based on the determination comprises:
   displaying a menu for selecting the external device to be connected with the electronic device;
   receiving a user input for selecting the external device; and
   connecting with the external device according to the user input via a wireless communication link.

5. The method of claim 3, wherein the connecting with the external device based on the determination comprises:
   automatically connecting with the external device via a wireless communication link.

6. The method of claim 3, wherein the connecting with the external device based on the determination comprises:
   automatically connecting with the external device via a wireless communication link if a user input for allowing to connect with the external device is received.

7. The method of claim 3, further comprising:
   if a plurality of determined external devices exists, determining an order of priority of the determined external devices; and
   automatically connecting with an external device having a highest priority from the determined external devices via a wireless communication link.

8. The method of claim 1, wherein the outputting the audio output of the electronic device comprises:
   outputting an audio output of the electronic device at a preset volume via the connected external device.

9. An electronic device comprising:
   a processor;
   a touchscreen display; and
   a memory,
   wherein the processor is configured to:
      receive an input for increasing an audio volume level of the electronic device,
      determine whether to connect with an external device based on the audio volume level and a maximum audio volume level of the electronic device when the input is received,
      connect with the external device based on the determination, and
      output an audio output of the electronic device via the connected external device.

10. The electronic device of claim 9, wherein the processor is further configured to determine whether the audio volume level is the maximum audio volume level before the receiving the input.

11. The electronic device of claim 9, wherein the processor is further configured to identify the external device to be connectable with the electronic device.

12. The electronic device of claim 11, wherein the processor is further configured to:
  control the touchscreen to display a menu for selecting the external device to be connected with the electronic device,
  receive a user input for selecting the external device, and
  connect with the external device according to the user input via a wireless communication link.

13. The electronic device of claim 11, wherein the processor is further configured to automatically connect with the external device via a wireless communication link.

14. The electronic device of claim 11, wherein the processor is further configured to automatically connect with the external device via a wireless communication link if a user input for allowing to connect with the external device is received.

15. The electronic device of claim 11, wherein the processor is further configured to:
  determine, if a plurality of determined external devices exists, an order of priority of the determined external devices, and
  automatically connect with an external device having a highest priority from the determined external devices via a wireless communication link.

16. The electronic device of claim 11, wherein the processor is further configured to output an audio output of the electronic device at a preset volume via the connected external device.

* * * * *